(12) United States Patent
Suzuki et al.

(10) Patent No.: US 6,624,692 B2
(45) Date of Patent: Sep. 23, 2003

(54) RADIO FREQUENCY AMPLIFIER WITH A WAVEGUIDE FILTER FOR ISOLATING AMPLIFYING ELEMENTS

(75) Inventors: Shigetaka Suzuki, Fukushima-ken (JP); Akira Takayama, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 134 days.

(21) Appl. No.: 09/836,393

(22) Filed: Apr. 17, 2001

(65) Prior Publication Data
US 2001/0035805 A1 Nov. 1, 2001

(30) Foreign Application Priority Data
Apr. 20, 2000 (JP) .......................... 2000-126240

(51) Int. Cl.[7] ................................. H05R 1/18
(52) U.S. Cl. ..................... 330/66; 330/68; 333/247; 333/208
(58) Field of Search ................ 333/247, 212, 333/248, 208, 66, 68

(56) References Cited

U.S. PATENT DOCUMENTS

| 5,274,340 A | 12/1993 | Deki et al. |
| 5,412,340 A | 5/1995 | Tanikoshi |
| 5,581,217 A | 12/1996 | Macdonald |
| 6,005,455 A | 12/1999 | Lindell et al. |

FOREIGN PATENT DOCUMENTS

| JP | 314401 | * 12/1989 | .................. 333/247 |
| JP | 01 314408 A | 12/1989 | |
| JP | 11-330760 | 11/1999 | |
| JP | 2000-77954 | 3/2000 | |

* cited by examiner

Primary Examiner—Benny Lee
(74) Attorney, Agent, or Firm—Brinks Hofer Gilson & Lione

(57) ABSTRACT

A radio frequency amplifier includes a waveguide filter positioned between a first and a second amplifier circuit, which reduces the distortion between the amplifier circuits. The waveguide includes a main body having a cavity.

19 Claims, 4 Drawing Sheets

RADIO FREQUENCY AMPLIFIER WITH A WAVEGUIDE FILTER FOR ISOLATING AMPLIFYING ELEMENTS

BACKGROUND OF THE INVENTION

1. Field of the Invention

The present invention relates to radio frequency amplifiers preferably used in satellite communication transmitters and transceivers.

2. Description of the Related Art

A radio frequency amplifier used in a millimeter-wave band (which has a frequency range from 20 to 40 GHz) is illustrated in FIGS. 6 and 7. A casing 31 made of metal, such as brass serves as a heat sink. The casing 31 includes a storage part 31a having an opening at an upper part and a side wall 31b (see FIG. 6) that surrounds the storage part 31a.

A circuit board 32, which is a printed circuit board, includes a pair of holes 32a and 32b shown in FIG. 6. As shown in FIG. 7, wiring patterns 33a and 33b, which are conductive, are positioned on a top surface of the circuit board 32. A filter 34, which is made of oblique conductive patterns, is positioned between the wiring patterns 33a and 33b between the holes 32a and 32b.

The filter 34 separates the top surface of the circuit board 32 into first and second regions R1 and R2 (see FIG. 7). As shown in FIG. 6, a ground pattern is positioned on the back surface of the circuit board 32. The ground pattern is disposed on a bottom portion 31c of the storage part 31a and the circuit board 32 is mounted in the storage part 31a by appropriate means.

Field effect transistors (FETs) 35a and 35b are inserted into the holes 32a and 32b of the circuit board 32. The FETs 35a and 35b are fixed through the holes to the bottom portion 31c of the casing 31 using electrically conductive adhesive. Wires 36 are bonded to the FETs 35a and 35b, and hence, the FETs 35a and 35b are connected to the wiring patterns 33a and 33b, which are formed in the first and second regions R1 and R2, respectively.

Various electrical components are soldered to the wiring patterns 33a and 33b formed in the first and second regions R1 and R2, respectively. With these electrical components and the FETs 35a and 35b, a first amplifier circuit 37a that includes a bias circuit is assembled in the first region R1, and a second amplifier circuit 37b that includes a bias circuit is assembled in the second region R2. A metal cover is mounted by appropriate means to cover the opening of the casing 31 to shield the storage part 31a.

In this conventional radio frequency amplifier, the filter 34 is formed of oblique conductive patterns. These conductive patterns can cause large transmission losses and can create distortion in the amplifier circuits 37a and 37b. Thus, the performance of this radio frequency amplifier is not always efficient and isolation between the first and second amplifier circuits 37a and 37b can be compromised.

SUMMARY OF THE INVENTION

A radio frequency amplifier includes a casing, preferably made of metal, which includes a storage part. A circuit board is positioned within the storage part, on which first and second amplifier circuits are positioned. A filter is positioned between the first and second amplifier circuits. The filter includes a waveguide filter that is preferably configured to attenuate or dampen interfering electrical signals, such as noise or electromagnetic interference that can adversely affect the first and second amplifier. The waveguide filter is positioned within the storage part between the first and second amplifier circuits and preferably provides electrical shielding between the first and second amplifier circuits.

The first and second amplifier circuits preferably include first and second amplifying elements, respectively, and the amplifying elements may be non-packaged or bare chips. The first and second amplifying elements can be connected to a wiring pattern on the circuit board, with the waveguide filter positioned between the amplifying elements.

The waveguide filter preferably includes a main body preferably formed of metal and having a cavity. The main body preferably separates the storage part into first and second chambers. The first amplifier circuit is preferably formed within the first chamber. The second amplifier circuit is preferably formed within the second chamber.

The cavity of the main body is preferably a concave cavity that that opens from the underside of the main body. The opening is preferably positioned above a bottom portion of the casing, wherein the bottom portion and the main body comprise the waveguide filter.

The bottom portion of the casing preferably includes a cavity that is also preferably a concave cavity. The cavity of the casing and the cavity of the main body is preferably arranged such that the cavities substantially align with each other, with a circuit board positioned between the bottom portion and the main body. A probe, preferably comprised of a portion of the wiring pattern of the circuit board, is preferably located in the storage part. The radio frequency amplifier may further include a cover that conceals the opening of the storage part. An interior surface of the cover preferably contacts a top surface of the waveguide filter.

According to a preferred embodiment, the transmission loss and distortion of amplifier circuits are relatively small in comparison to some conventional circuits, which provide a high-performance radio frequency amplifier. Unlike some conventional circuits, the first and second amplifier circuits are not directly coupled, and hence, electrical isolation is improved. Moreover, the structure of a radio frequency amplifier is simplified, and the radio frequency amplifier can be fabricated at a low cost. Furthermore, reliable electrical shielding between the first and second amplifier circuits is provided by a main body, further improving electrical isolation. Since a casing can preferably comprise a part of the waveguide filter, the structure of the waveguide filter is simplified. The waveguide filter preferably has a reduced height which reduces the cost of the waveguide filter. A circuit board can be easily mounted, and probes are preferably comprised of wiring patterns.

DESCRIPTION OF THE PREFERRED EMBODIMENTS

Figure 1:
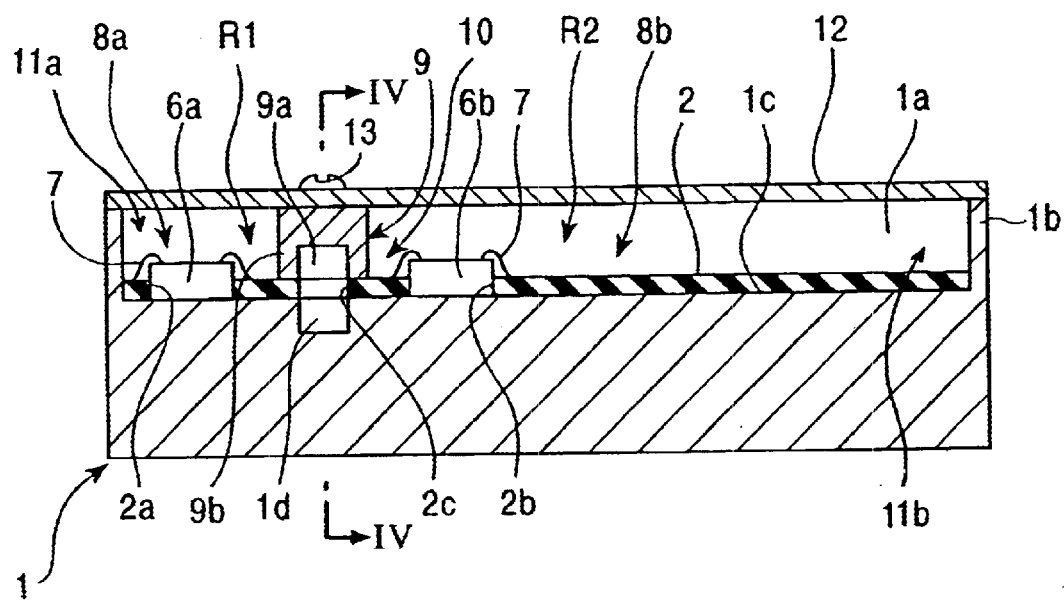
FIG. 1 is a sectional view of a radio frequency amplifier according to a first embodiment.
Figure 5:
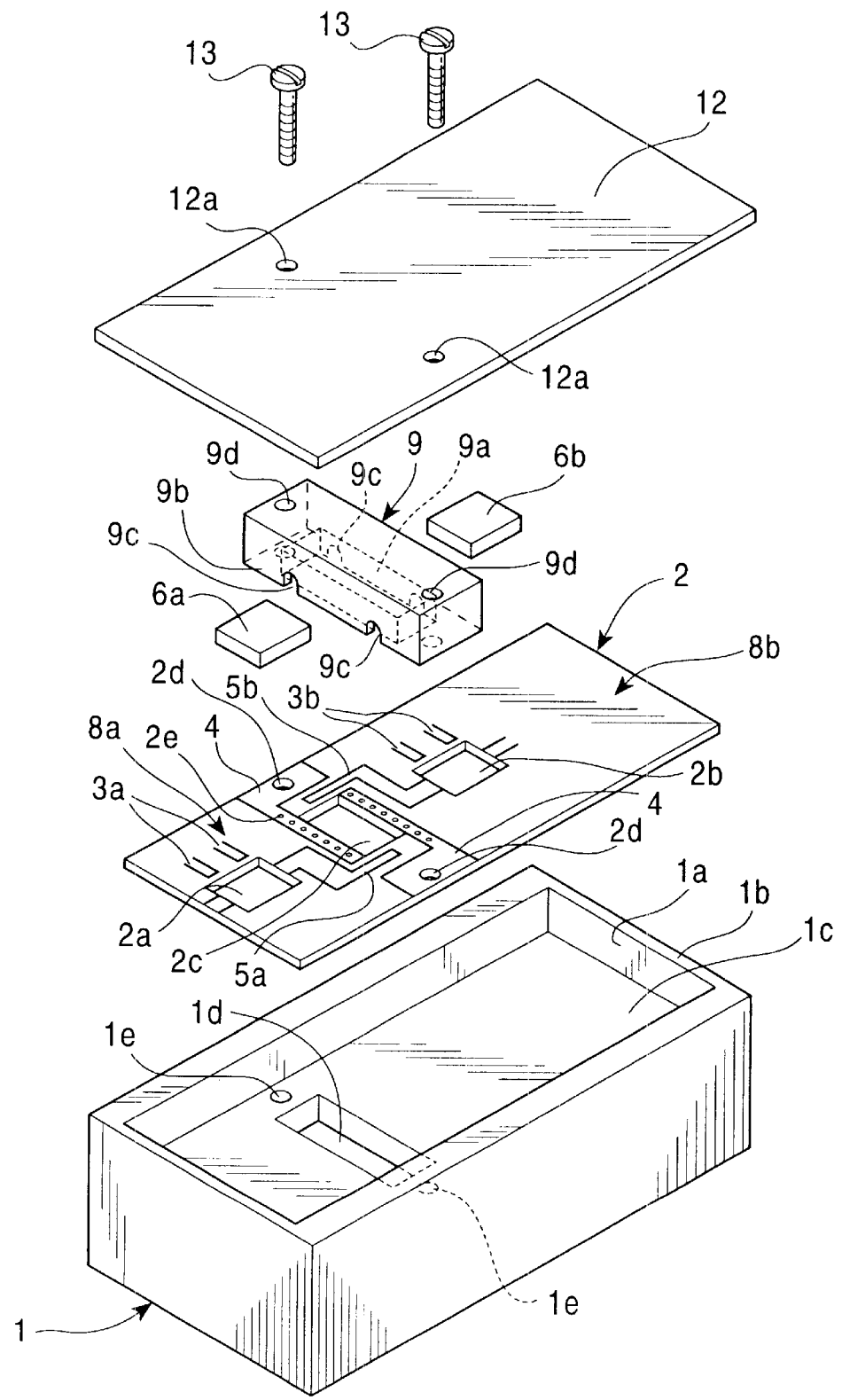
FIG. 5 is an exploded perspective view of the radio frequency amplifier.
Figure 6:
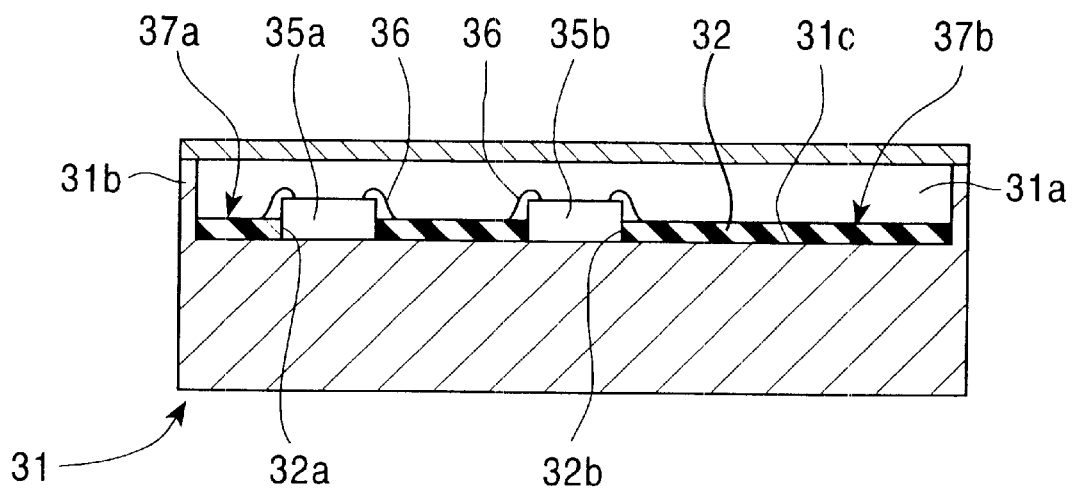
FIG. 6 is a sectional view of a conventional radio frequency amplifier.
Figure 7:
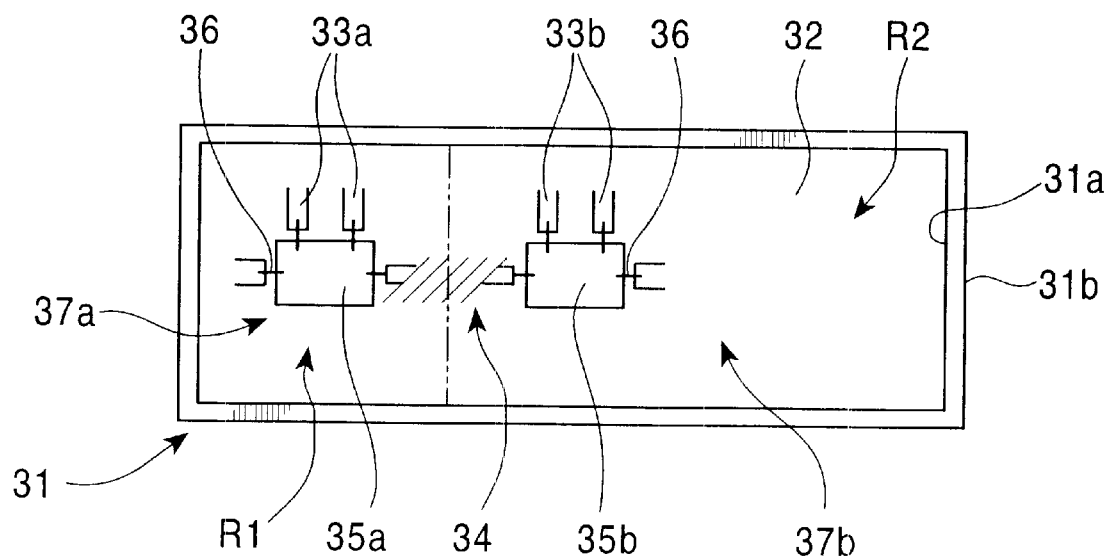
FIG. 7 is a plan view of the conventional radio frequency amplifier of FIG. 6.

Referring to FIGS. 1 and 5, a radio frequency amplifier preferably used in a millimeter-wave band (having frequency ranges from about 20 to about 40 GHz) transceiver or receiver and encompassing a preferred embodiment is described. A casing 1, preferably made of metal, such as brass or the like, absorbs heat like a heat sink. The casing 1 includes a storage part, such as the illustrated concave storage part 1a having an opening at an upper part or side of the storage part 1a. Preferably, a side wall 1b surrounds the storage part 1a and a substantially rectangular concave cavity 1d is preferably positioned at a bottom portion 1c of the storage part 1a. A pair of fastening holes 1e shown in FIG. 5 is preferably positioned near the cavity 1d.

Figure 3:
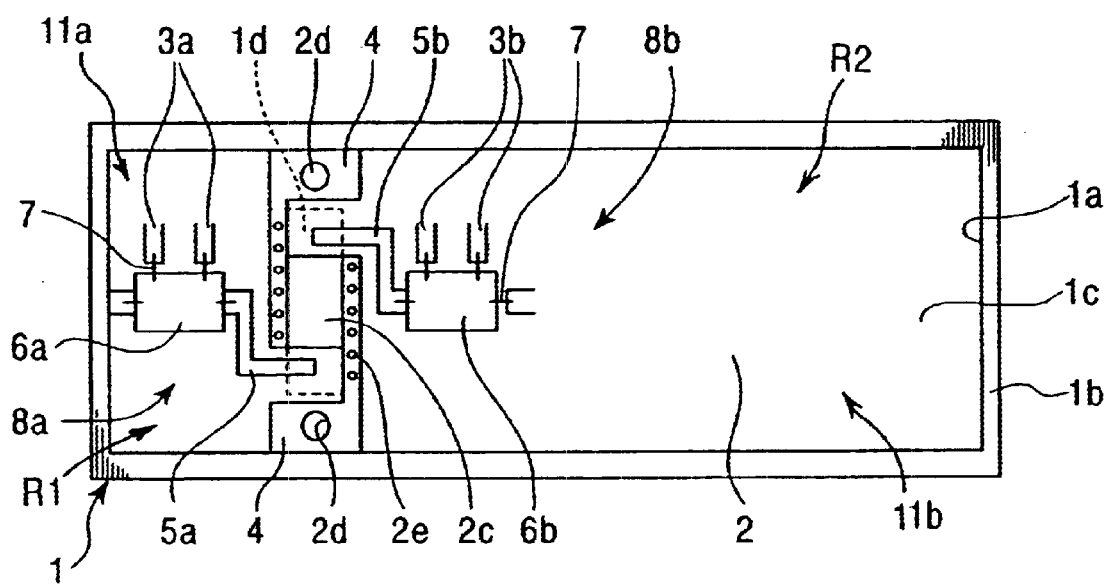
FIG. 3 is a plan view of the radio frequency amplifier with the cover and a main body removed.

As shown in FIG. 1, a circuit board 2, which is preferably a printed circuit board, includes a pair of holes 2a and 2b separated by a predetermined distance therebetween. A substantially rectangular through hole 2c having a shorter length than the cavity 1d of the casing 1 is positioned between holes 2a and 2b. As shown in FIG. 3, a pair of mounting holes 2d are positioned across from each other with the through hole 2c positioned therebetween. A plurality of small holes 2e surround sides of the through hole 2c.

Wiring patterns 3a and 3b made of conductive materials and a grounding pattern 4 made of a conductive material are positioned on a top surface of the circuit board 2. The through hole 2c separates the top surface of the circuit board 2 into first and second regions R1 and R2.

Portions of the wiring patterns 3a and 3b are positioned in the first and second regions R1 and R2. The wiring patterns 3a and 3b are positioned across from each other, with the through hole 2c provided therebetween. Each wiring pattern 3a and 3b extend to substantially the middle of the through hole 2c, and preferably are electrically coupled to probes 5a and 5b. The grounding pattern 4 is preferably formed around the side peripheries of the through hole 2c and the mounting holes 2d away from the probes 5a and 5b. The grounding pattern 4 is connected to a ground pattern formed on an entire back surface of the circuit board 2 by a connecting conductor provided through the small holes 2e.

Figure 4:
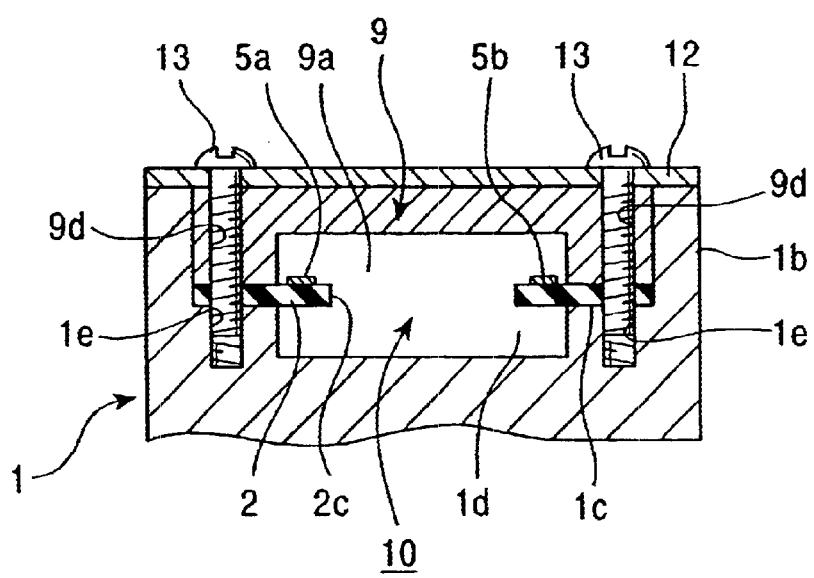
FIG. 4 is a sectional view taken along the line IV—IV of FIG. 1.

The preferred circuit board 2 is preferably stored in the storage part 1a such that the ground pattern is disposed on the bottom portion 1c of the storage part 1a. In this embodiment, the through hole 2c provides access to the cavity 1d shown in FIG. 4 provided on the bottom portion 1e, and the probes 5a and 5b shown in FIG. 3, which are positioned above the cavity 1d and terminate near ends of the cavity 1d.

Referring to FIGS. 1 and 3, amplifying elements 6a and 6b such as non-packaged or bare chips FETs are preferably inserted within the holes 2a and 2b (see FIG. 1) of the circuit board 2. The amplifying elements 6a and 6b are secured or coupled to the bottom portion 1c of the casing 1 through an adhesive, such as an electrically conductive adhesive. Wires 7 are preferably bonded to the amplifying elements 6a and 6b, and hence, the amplifying elements 6a and 6b are connected to the wiring patterns 3a and 3b positioned in the first and second regions R1 and R2, respectively.

Various electrical components are preferably connected to the wiring patterns 3a and 3b formed or positioned in the first and second regions R1 and R2, respectively. Through these electrical components and the amplifying elements 6a and 6b, a first amplifier circuit 8a that includes a bias circuit or the like is formed or positioned in the first region R1, and a second amplifier circuit 8b that includes a bias circuit or the like is formed or positioned in the second region R2.

As shown in FIG 5, a substantially rectangular main body 9, preferably made of metal, includes a cavity, preferably a concave cavity 9a having an opening accessible from the underside or bottom surface of the main body 9. A side wall 9b substantially surrounds the cavity 9a and a plurality of concave portions 9c or arches are positioned at the edge of the side wall 9b to provide access to the cavity 9a from the longitudinal sides of the main body 9. A pair of mounting holes 9d is configured to receive fasteners 13, such as screws to couple the main body 9 to the circuit board 2.

A lower opening of the main body 9 is preferably supported by the bottom portion 1c of the casing 1. The cavity 9a of the main body 9 is preferably aligned or opposed to the cavity 1d of the casing 1. The main body 9 is coupled to the grounding pattern 4 on the circuit board 2 via fasteners 13, such as the illustrated screws.

Figure 2:
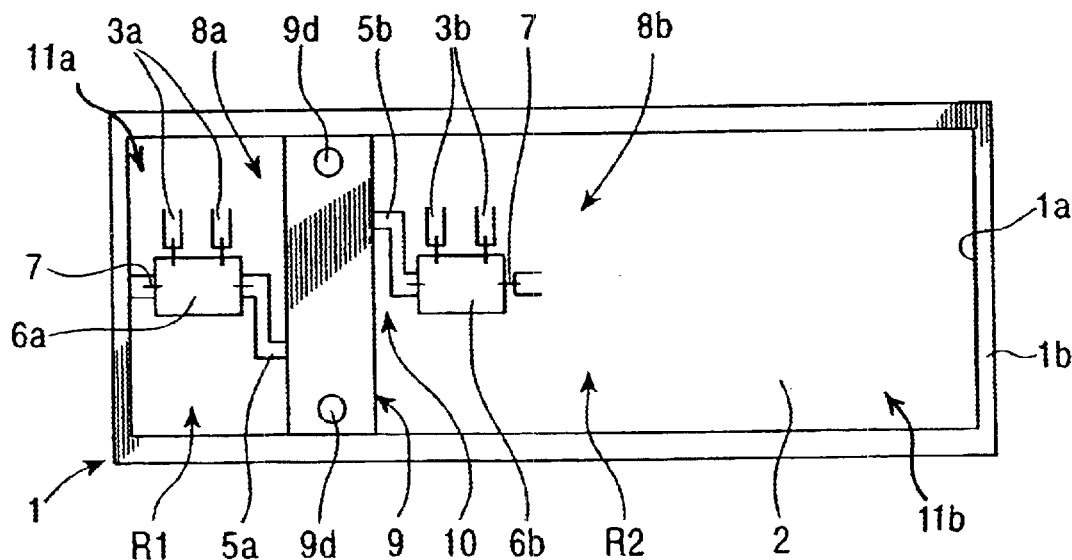
FIG. 2 is a plan view of the radio frequency amplifier with a cover removed.

The main body 9 is grounded by the grounding pattern 4, and the circuit board 2 is held between the main body 9 and the bottom portion 1c. Preferably, the probes 5a and 5b are aligned with one or at least one concave portion 9c or arch of the main body 9, and thus, the electrical insulating property of the main body 9 is preserved. The probes 5a and 5b, the main body 9, and the bottom portion 1c preferably comprise a waveguide filter 10 shown in FIGS. 1 and 2. The main body 9 of the waveguide filter 10 is preferably arranged substantially parallel to the side wall 1b defining the storage part 1a. Referring to FIGS. 1 and 5, the main body 9 separates the storage part 1a into first and second chambers 11a and 11b (see FIG. 1). In the first chamber 11a, the first amplifier circuit 6a is arranged. In the second chamber 11b, the second amplifier circuit 6b is arranged. The main body 9, which preferably forms part of the waveguide filter 10, provides electrical shielding between the first and second amplifier circuits 6a and 6b.

A cover 12 which preferably comprises a metal plate includes a pair of mounting holes 12a passing there through. The cover 12 is laid over the opening of the casing 1 to protect and electrically shield the first and second chambers 11a and 11b. A pair of fasteners 13, pass through the mounting holes 12a of the cover 12, the mounting holes 9d of the main body 9, and the mounting holes 2d of the circuit board 2. The fasteners 13 are received by the fastening holes 1e of the casing 1. The cover 12, the main body 9, and the circuit board 2 are mounted to the casing 1 using the screws in this embodiment, although other fasteners can be used in alternative embodiments.

By securing the fasteners 13, preferably the interior of the cover 12 is brought into contact with the top surface of the main body 9, which preferably comprises part of the waveguide filter 10. Electrical shielding between the first and second chambers 11a and 11b and heat dissipation is improved by this substantially continuous or continuous ground that preferably interconnects the grounds on the top and bottom surfaces of the circuit board 2 to the cover 12 and the casing 1. By pressing the main body 9 downward using the cover 12, the circuit board 2 is securely held between the main body 9 and the bottom portion 1c. Hence, the circuit board 2 is secure, and contact between the main body 9 and the grounding pattern 4 is ensured. Electrical insulation is preferably provided by the entire or substantially the entire bottom surface of the circuit board 2 interconnected to the grounded runs of the top surface of the circuit board 2, the grounded main body 9, and the grounded casing 1 and cover 12 With the above arrangement, a radio frequency amplifier according to a preferred embodiment is preferably assembled.

While various embodiments of the invention have been described, it will be apparent to those of ordinary skill in the art that many more embodiments and implementations are possible. For example, the waveguide filter 10 is not limited to the above described structures, as the waveguide filter 10 can encompass any system or material that guides electromagnetic waves including, but not limited to, a hollow conductor, a solid dielectric, or a dielectric filled conductor. Accordingly, the invention is not to be restricted except in light of the attached claims and their equivalents.

What is claimed is:

1. A radio frequency amplifier comprising:
   a casing comprising a storage part;
   a circuit board received within said storage part, said circuit board comprising a first and a second amplifier; and
   a waveguide filter positioned between said first and second amplifier circuits within said storage part, said waveguide filter enclosing a plurality of cantilevered portions of said circuit board, wherein said waveguide filter is configured to provide electrical shielding between said first and second amplifier circuits.

2. A radio frequency amplifier according to claim 1, further comprising a cover that conceals an opening in said storage part, wherein an inside surface of said cover is in contact with a top surface of a said waveguide filter.

3. A radio frequency amplifier according to claim 1, wherein:
   said first and said second amplifier circuits comprise first and second amplifying elements, respectively, the first and second amplifying elements comprising non-packaged chips; and
   the first and second amplifying elements are coupled to a wiring pattern positioned on said circuit board, with said waveguide filter provided between the first and second amplifying elements.

4. A radio frequency amplifier, according to claim 3, wherein:
   said waveguide filter comprises a main body having a first cavity;
   the main body being positioned to separate said storage part into first and second chambers; wherein
   said first amplifier circuit is positioned within said first chamber; and
   said second amplifier circuit is positioned within said second chamber.

5. A radio frequency amplifier according to claim 4, further comprising:
   a respective probe positioned on said plurality of cantilevered portions of said circuit board within said storage part; wherein
   a bottom portion of said casing includes a second cavity; and
   said second cavity of said casing and said first cavity of said main body are positioned across from each other, with said circuit board being positioned between said bottom portion and said main body.

6. A radio frequency amplifier according to claim 4, wherein:
   said first cavity of said main body includes an opening positioned on the underside of said main body; and
   said opening is positioned across from a bottom portion of said casing, wherein said bottom portion and said main body comprise said waveguide filter.

7. The radio frequency amplifier according to claim 6, wherein said first cavity of said main body comprises a concave cavity.

8. A radio frequency amplifier according to claim 1, wherein:
   the waveguide filter comprises a conducting main body having a first cavity;
   said main body being positioned to separate said storage part into a first chamber and a second chamber and being configured to substantially attenuate electrical interference between said first and said second chambers; wherein
   said first amplifier circuit is positioned within said first chamber; and
   said second amplifier circuit is positioned within said second chamber.

9. A radio frequency amplifier according to claim 8, wherein:
   said first cavity of said main body comprises an opening positioned on an underside of said main body; and
   said opening is positioned across from a bottom portion of said casing, wherein said bottom portion and said main body comprise said waveguide filter.

10. The radio frequency amplifier according to claim 9, wherein said first cavity of said main body comprises a concave cavity.

11. A radio frequency amplifier according to claim 8, further comprising a respective probe positioned on said plurality of cantilevered portions of said circuit board within said storage part; wherein
    a bottom portion of said casing includes a second cavity; and
    said second cavity of said casing and said first cavity of said main body are aligned with each other, with said circuit board being positioned between said bottom portion and said main body.

12. The radio frequency amplifier according to claim 8, wherein said main body is configured to attenuate selected electromagnetic signals.

13. The radio amplifier of claim 12 wherein said main body comprises a plurality of arches positioned near longitudinal sides of said first cavity and said first cavity having an interior height greater than a height of said plurality of arches.

14. The radio amplifier of claim 13 further comprising a plurality of probes, wherein each of said probes passes through one of said arches.

15. A radio frequency amplifier comprising:
    a storage part;
    a circuit board coupled within said storage part, said circuit board comprising a first circuit and a second circuit; and
    a waveguide filter positioned between said first circuit and said second circuit;
    said waveguide filter enclosing a first cantilevered portion of said circuit board and a second cantilevered portion of said circuit board.

16. The radio frequency amplifier of claim 15 further comprising a first probe coupled to an end of said first cantilevered portion and a second probe coupled to an end of said second cantilevered portion, said first cantilevered end being positioned near a first end of said waveguide filter and said second cantilevered end being positioned near a second end of said waveguide filter.

17. The radio frequency amplifier of claim 16 further comprising a main body, defining said waveguide filter, coupled to said circuit board and a bottom portion coupled to said circuit board, wherein a cavity that encloses the first cantilevered portion and the second cantilevered portion comprises a first hollow portion bounded by said main body and a second hollow portion bounded by said bottom portion.

18. A radio frequency amplifier comprising:
   a lower portion;
   a storage part coupled to said lower portion;
   a circuit board coupled to said storage part and supported by said lower portion, said circuit board comprising a first circuit and a second circuit; and
   a waveguide filter positioned between said first circuit and said second circuit;
   said wave guide filter enclosing a first cantilevered portion of said circuit board and a second cantilevered portion of said circuit board, said first and said second cantilevered portions having ends enclosed by a cavity bounded by a hollow portion formed in said lower portion.

19. The radio frequency amplifier of claim 18 further comprising a main body, defining said waveguide filter, coupled to a top side of said circuit board, wherein the cavity is bounded by a second hollow portion provided in said main body.

* * * * *